US010998308B2

(12) United States Patent
Dai et al.

(10) Patent No.: US 10,998,308 B2
(45) Date of Patent: May 4, 2021

(54) AREA-EFFICIENT BI-DIRECTIONAL ESD STRUCTURE

(71) Applicant: Texas Instruments Incorporated, Dallas, TX (US)

(72) Inventors: Xianzhi Dai, Shanghai (CN); Muhammad Yusuf Ali, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/518,304

(22) Filed: Jul. 22, 2019

(65) Prior Publication Data

US 2021/0028163 A1 Jan. 28, 2021

(51) Int. Cl.
*H01L 27/02* (2006.01)
*H01L 21/76* (2006.01)
*H01L 21/768* (2006.01)

(52) U.S. Cl.
CPC .... *H01L 27/0266* (2013.01); *H01L 21/76895* (2013.01); *H01L 27/0259* (2013.01); *H01L 27/0288* (2013.01)

(58) Field of Classification Search
CPC ............... H01L 21/76; H01L 21/7687; H01L 21/76895; H01L 27/02; H01L 27/025; H01L 27/026; H01L 27/028; H01L 27/0259; H01L 27/0266; H01L 27/0282
USPC ........................................................ 257/173
See application file for complete search history.

(56) References Cited

U.S. PATENT DOCUMENTS

| 7,034,363 | B2 | 4/2006 | Chen |
| 7,394,638 | B2 | 7/2008 | Ahmad et al. |
| 7,701,682 | B2 | 4/2010 | Goyal et al. |
| 2010/0171149 | A1 | 7/2010 | Denison et al. |
| 2017/0358568 | A1 | 12/2017 | Edwards et al. |
| 2018/0145064 | A1 | 5/2018 | Gallerano et al. |
| 2018/0337170 | A1* | 11/2018 | Kanawati ................ H01L 23/66 |
| 2019/0109127 | A1* | 4/2019 | Gallerano ........... H01L 29/7436 |

* cited by examiner

*Primary Examiner* — Fazli Erdem
(74) *Attorney, Agent, or Firm* — Andrew R. Ralston; Charles A. Brill; Frank D. Cimino (57) ABSTRACT

A semiconductor device has a protected node and a reference node, and a bi-directional ESD structure electrically coupled between the protected node and the reference node. The bi-directional ESD structure includes a main transistor electrically coupled between the protected node and the reference node, an upper control transistor with current nodes electrically coupled between the protected node and a control node of the main transistor, and a lower control transistor with current nodes electrically coupled between the reference node and a control node of the main transistor. The bi-directional ESD structure also includes an upper trigger network configured to provide a transient on-state signal to the upper control transistor from a positive electrical pulse on the protected node. The bi-directional ESD structure further includes a lower trigger network configured to provide a transient on-state signal to the lower control transistor from a negative electrical pulse on the protected node.

16 Claims, 6 Drawing Sheets

AREA-EFFICIENT BI-DIRECTIONAL ESD STRUCTURE

FIELD

This disclosure relates to the field of semiconductor devices. More particularly, this disclosure relates to electrostatic discharge (ESD) structures in semiconductor devices.

BACKGROUND

Electrostatic discharge (ESD) events pose performance and reliability risks to semiconductor devices. It is desirable for ESD protection circuits to handle both positive and negative current flow, that is, provide bi-directional protection. For some devices, the protected input/output (I/O) pad may handle positive and negative voltages during operation, requiring the corresponding ESD circuit to withstand the operating voltages without breakdown or degradation. Attaining bi-directional protection using back-to-back components has generally resulted in unwanted increases in the size of the ESD structure. Attaining bi-directional protection without back-to-back components has generally required added photolithographic operations, resulting in increased fabrication complexity and cost.

SUMMARY

The present disclosure introduces a semiconductor device having a protected node and a reference node, and a bi-directional electrostatic discharge (ESD) structure electrically coupled between the protected node and the reference node. The bi-directional ESD structure includes a main transistor with current nodes electrically coupled between the protected node and the reference node, an upper control transistor with current nodes electrically coupled between the protected node and a control node of the main transistor, and a lower control transistor with current nodes electrically coupled between the reference node and the control node of the main transistor. The bi-directional ESD structure also includes an upper trigger network electrically coupled between the protected node and the reference node, with an upper trigger node electrically coupled to a control node of the upper control transistor, the upper trigger network being configured to provide a transient on-state signal at the upper trigger node from a positive electrical pulse on the protected node relative to the reference node. The bi-directional ESD structure further includes a lower trigger network electrically coupled between the protected node and the reference node, with a lower trigger node electrically coupled to a control node of the lower control transistor, the lower trigger network being configured to provide a transient on-state signal at the lower trigger node from a negative electrical pulse on the protected node relative to the reference node.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to devices, it is not intended that these illustrations be a limitation on the scope or applicability of the present invention. It is not intended that the devices of the present invention be limited to the physical structures illustrated. These structures are included to demonstrate the utility and application of the present invention to presently preferred embodiments.

A semiconductor device has a protected node, such as an input/output (I/O) pad, and a reference node, such as an underlying layer of a semiconductor material in a substrate held at a ground potential during operation of the semiconductor device. The semiconductor device also includes a bi-directional electrostatic discharge (ESD) structure electrically coupled between the protected node and the reference node. For the purposes of this disclosure, the term "electrically coupled" refers to electrically coupled by materials or structures such as metal interconnects or semiconductor material, that conduct direct (DC) electrical currents. The bi-directional ESD structure includes a main transistor with a first ESD current node electrically coupled to the protected node and a second ESD current node electrically coupled to the reference node. The first ESD current node and the second ESD current node carry a majority of current through the main transistor in an on-state, during operation. The bi-directional ESD structure includes an upper control transistor with current nodes electrically coupled between the protected node and a control node of the main transistor, and a lower control transistor with current nodes electrically coupled between the reference node and the control node of the main transistor. An on-state signal applied to the control node of the main transistor places the main transistor in an on-state, so that a resistance of the main transistor between the first ESD current node and the second ESD current node is reduced from a quiescent or off-state value. The current nodes of the upper control transistor carry a majority of current through the upper control transistor in an on-state, during operation, and similarly for the current nodes of the lower control transistor.

The bi-directional ESD structure also includes an upper trigger network electrically coupled between the protected node and the reference node. The upper trigger network has an upper trigger node electrically coupled to a control node of the upper control transistor. The upper trigger network is configured to provide a transient on-state signal at the upper trigger node from a positive electrical pulse on the protected node relative to the reference node. The bi-directional ESD structure further includes a lower trigger network electrically coupled between the protected node and the reference node. The lower trigger network has a lower trigger node electrically coupled to a control node of the lower control transistor. The lower trigger network is configured to provide a transient on-state signal at the lower trigger node from a negative electrical pulse on the protected node relative to the reference node.

Figure 1:
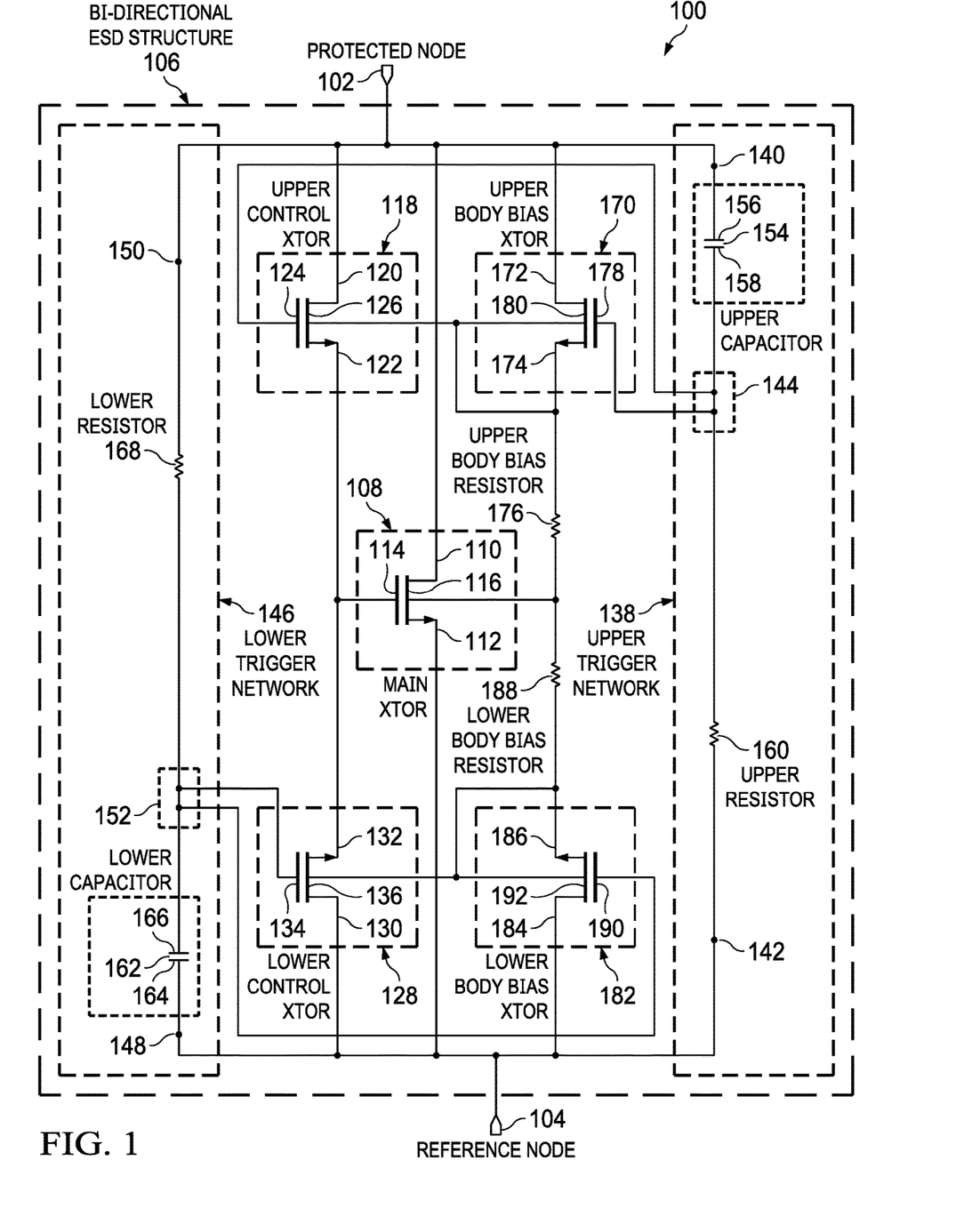
FIG. 1 is a circuit diagram of an example semiconductor device having a bi-directional ESD structure.

FIG. 1 is a circuit diagram of an example semiconductor device having a bi-directional ESD structure. The semiconductor device 100 has a protected node 102 and a reference node 104. The protected node 102 may be electrically coupled to an I/O pad of the semiconductor device 100 or a power node of the semiconductor device 100, for example. The reference node 104 may be electrically coupled to a ground node of the semiconductor device 100, such as an underlying semiconductor layer or a metallized back surface of the semiconductor device 100. The semiconductor device 100 includes the bi-directional ESD structure 106, which is electrically coupled to the protected node 102 and the reference node 104.

The bi-directional ESD structure 106 includes a main transistor 108. In this example, the main transistor 108 is manifested as an n-channel main metal oxide semiconductor (NMOS) transistor 108. The main NMOS transistor 108 includes a first ESD current node 110 electrically coupled to the protected node 102, and a second ESD current node 112 electrically coupled to the reference node 104. In this example, the first ESD current node 110 is manifested as a first source/drain node 110 of the main NMOS transistor 108, and the second ESD current node 112 is manifested as a second source/drain node 112 of the main NMOS transistor 108. The main NMOS transistor 108 also includes an ESD control node 114, which is manifested as a gate node 114 of the main NMOS transistor 108. The main NMOS transistor 108 further includes a body node 116.

The bi-directional ESD structure 106 includes an upper control transistor 118, which is manifested as an upper control NMOS transistor 118 in this example. The upper control NMOS transistor 118 includes a first upper current node 120 electrically coupled to the protected node 102. In this example, the first upper current node 120 is manifested as a drain node 120 of the upper control NMOS transistor 118. The upper control NMOS transistor 118 includes a second upper current node 122 electrically coupled to the gate node 114 of the main NMOS transistor 108. In this example, the second upper current node 122 is manifested as a source node 122 of the upper control NMOS transistor 118. The upper control NMOS transistor 118 also includes an upper control node 124, manifested as a gate node 124 of the upper control NMOS transistor 118, in this example. The upper control NMOS transistor 118 further includes a body node 126.

The bi-directional ESD structure 106 includes a lower control transistor 128, which is manifested as a lower control NMOS transistor 128 in this example. The lower control NMOS transistor 128 includes a first lower current node 130 electrically coupled to the reference node 104. In this example, the first lower current node 130 is manifested as a drain node 130 of the lower control NMOS transistor 128. The lower control NMOS transistor 128 includes a second lower current node 132 electrically coupled to the gate node 114 of the main NMOS transistor 108. In this example, the second lower current node 132 is manifested as a source node 132 of the lower control NMOS transistor 128. The lower control NMOS transistor 128 also includes a lower control node 134, manifested as a gate node 134 of the lower control NMOS transistor 128, in this example. The lower control NMOS transistor 128 further includes a body node 136.

The bi-directional ESD structure 106 includes an upper trigger network 138 electrically coupled between the protected node 102 and the reference node 104. The upper trigger network 138 includes an upper input node 140 electrically coupled to the protected node 102, and an upper relaxation node 142 electrically coupled to the reference node 104. The upper trigger network 138 further includes an upper trigger node 144 electrically coupled to the gate node 124 of the upper control NMOS transistor 118.

The bi-directional ESD structure 106 includes a lower trigger network 146 electrically coupled between the protected node 102 and the reference node 104. The lower trigger network 146 includes a lower input node 148 electrically coupled to the reference node 104, and a lower relaxation node 150 electrically coupled to the protected node 102. The lower trigger network 146 further includes a lower trigger node 152 electrically coupled to the gate node 134 of the lower control NMOS transistor 128.

The upper trigger network 138 is configured to provide a transient on-state signal at the upper trigger node 144 from a positive trigger event, that is, a positive electrical pulse on the protected node 102 relative to the reference node 104. The upper trigger network 138 is further configured to reduce, or relax, the transient on-state signal at the upper trigger node 144 to less than half, that is, less than 50 percent, of a peak value of the transient on-state signal within an upper relaxation time, which may be 1 nanosecond to 100 nanoseconds for a snapback mode of operation, or may be 500 nanoseconds to 10 microseconds for an active mode of operation. The lower trigger network 146 is configured to provide a transient on-state signal at the lower trigger node 152 from a negative trigger event, that is, a negative electrical pulse on the protected node 102 relative to the reference node 104. The lower trigger network 146 is further configured to reduce, or relax, the transient on-state signal at the lower trigger node 152 to less than half, that is less than 50 percent, of a peak value of the transient on-state signal within a lower relaxation time, which may be approximately equal to the upper relaxation time.

In this example, the upper trigger network 138 includes an upper capacitor 154 which includes an upper first plate 156 electrically coupled to the upper input node 140, and an upper second plate 158 electrically coupled to the upper trigger node 144. The upper trigger network 138 of this example further includes an upper resistor 160 which couples the upper trigger node 144 to the upper relaxation node 142. Thus, the upper trigger network 138 provides a first order high-pass resistor-capacitor (RC) filter from the protected node 102 to the reference node 104. A positive electrical pulse on the protected node 102 relative to the reference node 104 is capacitively electrically coupled through the upper capacitor 154 to provide the transient on-state signal at the upper trigger node 144. The transient on-state signal at the upper trigger node 144 is subsequently reduced by current from the upper trigger node 144 to the upper relaxation node 142 through the upper resistor 160. The upper relaxation node 142 provides a current sink for the transient on-state signal at the upper trigger node 144. The transient on-state signal is maintained at the upper trigger node 144 for the upper relaxation time, which is proportional to a product of a capacitance of the upper capacitor 154 and a resistance of the upper resistor 160.

Similarly, in this example, the lower trigger network 146 includes a lower capacitor 162 which includes a lower first plate 164 electrically coupled to the lower input node 148, a lower second plate 166 electrically coupled to the lower trigger node 152, and a lower resistor 168 which couples the lower trigger node 152 to the lower relaxation node 150. The lower trigger network 146 provides a first order high-pass RC filter from the reference node 104 to the protected node 102. A negative electrical pulse on the protected node 102 relative to the reference node 104 is capacitively electrically coupled through the lower capacitor 162 to provide the transient on-state signal at the lower trigger node 152, which is subsequently reduced by current to the lower relaxation node 150 through the lower resistor 168. The lower relaxation node 150 provides a current sink for the transient on-state signal at the lower trigger node 152. The transient on-state signal is maintained at the lower trigger node 152 for the lower relaxation time, which is proportional to a product of a capacitance of the lower capacitor 162 and a resistance of the lower resistor 168.

The bi-directional ESD structure 106 of this example further includes an upper body bias transistor 170, having a first upper body bias current node 172 electrically coupled to the protected node 102, and a second upper body bias current node 174 electrically coupled to the body node 116 of the main NMOS transistor 108 through an upper body bias resistor 176. In this example, the upper body bias transistor 170 is manifested as an upper body bias NMOS transistor 170, the first upper body bias current node 172 is manifested as a drain node 172 of the upper body bias NMOS transistor 170, and the second upper body bias current node 174 is manifested as a source node 174 of the upper body bias NMOS transistor 170. The upper body bias NMOS transistor 170 also includes an upper body bias control node 178, manifested as a gate node 178 of the upper body bias NMOS transistor 170. The gate node 178 of the upper body bias NMOS transistor 170 is electrically coupled to the upper trigger node 144. The upper body bias NMOS transistor 170 further includes a body node 180, which is electrically coupled to the source node 174 of the upper body bias NMOS transistor 170. The body node 180 of the upper body bias NMOS transistor 170 is electrically coupled to the body node 126 of the upper control NMOS transistor 118.

Similarly, the bi-directional ESD structure 106 of this example further includes a lower body bias transistor 182, manifested as a lower body bias NMOS transistor 182, having a first lower body bias current node 184 manifested as a drain node 184 of the lower body bias NMOS transistor 182, and a second lower body bias current node 186 manifested as a source node 186 of the lower body bias NMOS transistor 182. The drain node 184 of the lower body bias NMOS transistor 182 is electrically coupled to the reference node 104, and the source node 186 of the lower body bias NMOS transistor 182 is electrically coupled to the body node 116 of the main NMOS transistor 108 through a lower body bias resistor 188. The lower body bias NMOS transistor 182 also includes a lower body bias control node 190, manifested as a gate node 190 of the lower body bias NMOS transistor 182. The gate node 190 of the lower body bias NMOS transistor 182 is electrically coupled to the lower trigger node 152. The lower body bias NMOS transistor 182 further includes a body node 192, which is electrically coupled to the source node 186 of the lower body bias NMOS transistor 182. The body node 192 of the lower body bias NMOS transistor 182 is electrically coupled to the body node 126 of the lower control NMOS transistor 128.

When the semiconductor device 100 is unpowered, the main NMOS transistor 108, the upper control NMOS transistor 118, the lower control NMOS transistor 128, the upper body bias NMOS transistor 170, and the lower body bias NMOS transistor 182 are in off states, that is, no currents flow through the NMOS transistors 108, 118, 128, 170, and 182. A transient on-state signal at the upper trigger node 144, generated by a positive electrical pulse on the protected node 102 relative to the reference node 104, turns on the upper control NMOS transistor 118 and the upper body bias NMOS transistor 170. The lower control NMOS transistor 128 and the lower body bias NMOS transistor 182 remain in off states. The positive electrical pulse on the protected node 102 causes current to flow from the protected node 102 through the upper control NMOS transistor 118, raising a potential at the gate node 114 of the main NMOS transistor 108 to an on-state potential relative to the second source/drain node 112, and turning on the main NMOS transistor 108. In this case, the second source/drain node 112 functions as a source node of the main NMOS transistor 108. Current subsequently flows through the main NMOS transistor 108 from the protected node 102 to the reference node 104, reducing a potential difference between the protected node 102 and the reference node 104. The positive electrical pulse on the protected node 102 also causes current to flow from the protected node 102 through the upper body bias NMOS transistor 170, the upper body bias resistor 176, the lower body bias resistor 188, and a pn junction between the body node 192 and the drain node 184 of the lower body bias NMOS transistor 182, to the reference node 104, raising a potential at the body node 116 of the main NMOS transistor 108 relative to the second source/drain node 112. Raising the potential at the body node 116 of the main NMOS transistor 108 relative to the second source/drain node 112 turns on a parasitic bipolar junction transistor (BJT) in the main NMOS transistor 108, causing more current to flow through the main NMOS transistor 108 from the protected node 102 to the reference node 104, further reducing a potential difference between the protected node 102 and the reference node 104. In this case, the parasitic BJT in the main NMOS transistor 108 includes the first source/drain node 110 as a collector, the body node 116 as a base, and the second source/drain node 112 as an emitter. As the on-state signal at the upper trigger node 144 is reduced by the upper trigger network 138, the potential on the gate node 114 of the main NMOS transistor 108 drops below a potential sufficient to maintain the main NMOS transistor 108 in an on-state; however, the parasitic BJT in the main NMOS transistor 108 may remain on, until the potential difference between the protected node 102 and the reference node 104 is reduced to a desired level, for example, less than 5 volts.

A negative electrical pulse on the protected node 102 relative to the reference node 104 is reduced by a similar process. When the semiconductor device 100 is unpowered, the main NMOS transistor 108, the upper control NMOS transistor 118, the lower control NMOS transistor 128, the upper body bias NMOS transistor 170, and the lower body bias NMOS transistor 182 are in off states. A transient on-state signal at the lower trigger node 152, generated by the negative electrical pulse on the protected node 102 relative to the reference node 104, turns on the lower control NMOS transistor 128 and the lower body bias NMOS transistor 182. The upper control NMOS transistor 118 and the upper body bias NMOS transistor 170 remain in off states. The negative electrical pulse on the protected node 102 causes current to flow from the reference node 104 through the lower control NMOS transistor 128, raising a potential at the gate node 114 of the main NMOS transistor 108 to an on-state potential relative to the first source/drain node 110 of the main NMOS transistor 108, and turning on the main NMOS transistor 108. In this case, the first source/drain node 110 functions a source node of the main NMOS transistor 108. Current subsequently flows through the main NMOS transistor 108 from the reference node 104 to the protected node 102, reducing a potential difference between the protected node 102 and the reference node 104. The negative electrical pulse on the protected node 102 also causes current to flow from the reference node 104 through the lower body bias NMOS transistor 182, the lower body bias resistor 188, the upper body bias resistor 176, and a pn junction between the body node 180 and the drain node 172 of the upper body bias NMOS transistor 170, to the protected node 102, raising a potential at the body node 116 of the main NMOS transistor 108 relative to the first source/drain node 110 of the main NMOS transistor 108. Raising the potential at the body node 116 of the main NMOS transistor 108 relative to the first source/drain node 110 turns on the parasitic BJT in the main NMOS transistor 108, causing more current to flow through the main NMOS transistor 108 from the reference node 104 to the protected node 102, further reducing a potential difference between the protected node 102 and the reference node 104. In this case, the parasitic BJT in the main NMOS transistor 108 includes the second source/drain node 112 as a collector, the body node 116 as a base, and the first source/drain node 110 as an emitter. As the on-state signal at the lower trigger node 152 is reduced by the lower trigger network 146, the potential on the gate node 114 of the main NMOS transistor 108 drops below a potential sufficient to maintain the main NMOS transistor 108 in an on-state; however, the parasitic BJT in the main NMOS transistor 108 may remain on, until the potential difference between the protected node 102 and the reference node 104 is reduced to a desired level.

The bi-directional ESD structure 106 thus reduces the potential difference between the protected node 102 and the reference node 104 for both a positive electrical pulse and a negative electrical pulse on the protected node 102 relative to the reference node 104, using only the main NMOS transistor 108 to conduct currents between the protected node 102 and the reference node 104. Using the main NMOS transistor 108 to conduct currents between the protected node 102 and the reference node 104 may advantageously enable the bi-directional ESD structure 106 to provide a desired level of protection from the positive electrical pulse and the negative electrical pulse while enabling a smaller area than a comparable ESD structure using two transistors to conduct currents between the protected node 102 and the reference node 104. Additional instances of the bi-directional ESD structure 106 may be included in the semiconductor device 100 to protect additional I/O pads, further accruing advantages of lower area.

Figure 2A:
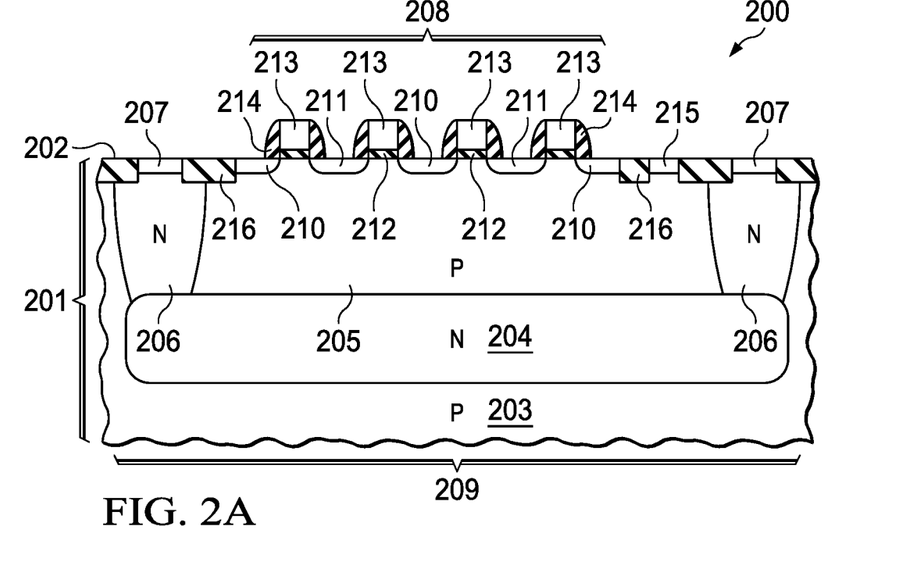
FIG. 2A through FIG. 2F are cross sections of an example semiconductor device having a bi-directional ESD structure.

FIG. 2A through FIG. 2F are cross sections of an example semiconductor device having a bi-directional ESD structure. Referring to FIG. 2A, the semiconductor device 200 includes a substrate 201 which may be manifested as part of a semiconductor wafer, for example. The substrate 201 has a top surface 202. The substrate 201 includes a semiconductor material 203, which may be an epitaxial layer or a top portion of a bulk semiconductor wafer. The semiconductor material 203 has a first conductivity type. In this example, the semiconductor device 200 will be described with the first conductivity type being p-type, as indicated in FIG. 2A. The semiconductor material 203 may optionally extend to the top surface 202, as depicted in FIG. 2A.

The semiconductor device 200 includes a first buried layer 204 in the substrate 201. The first buried layer 204 has a second conductivity type, opposite of the first conductivity type; the second conductivity type is n-type, in this example. The semiconductor device 200 includes a first isolated well 205 in the substrate 201, between the first buried layer 204 and the top surface 202. The first isolated well 205 has the first conductivity type. The first isolated well 205 is vertically isolated from the semiconductor material 203 by the first buried layer 204. The term "vertically" refers to a direction perpendicular to the top surface 202 of the substrate 201. The first isolated well 205 is laterally isolated from the semiconductor material 203 by a first isolation structure 206 in the substrate 201. The terms "laterally" and "lateral" refer to direction parallel to the top surface 202 of the substrate 201. The first isolation structure 206 may be manifested as regions 206 of the second conductivity type, sometimes referred to as sinkers 206, as depicted in FIG. 2A. The semiconductor device 200 may include optional first sinker contact regions 207 that are heavily doped to provide low resistance connections to the first isolation structure 206. Other manifestations for the first isolation structure 206, such as deep trenches, are within the scope of this example. The semiconductor device 200 includes an electrical connection to the first buried layer 204 to enable a bias potential to be applied to the first buried layer 204 with respect to the semiconductor material 203, to provide a desired isolation of the first isolated well 205. In the instant example as depicted in FIG. 2A, the electrical connection to the first buried layer 204 is provided by the first isolation structure 206.

The semiconductor device 200 includes a main NMOS transistor 208, which is part of the bi-directional ESD structure 209. The bi-directional ESD structure 209 corresponds to the bi-directional ESD structure 106 of FIG. 1, and the main NMOS transistor 208 corresponds to the main NMOS transistor 108 of FIG. 1. The first isolated well 205 provides a body region for the main NMOS transistor 208. The main NMOS transistor 208 includes first source/drain regions 210 in the substrate 201, and second source/drain regions 211 in the substrate 201. The first source/drain regions 210 and the second source/drain regions 211 have the second conductivity type. The main NMOS transistor 208 further includes a gate dielectric layer 212 on the top surface 202 of the substrate 201, and a gate 213 on the gate dielectric layer 212, partially overlapping the first source/drain regions 210 and the second source/drain regions 211. The gate dielectric layer 212 may include silicon dioxide, nitridated silicon dioxide, hafnium oxide, or zirconium oxide, for example, and may be 1.5 nanometers to 10 nanometers thick. The gate 213 may include, for example, polycrystalline silicon, metal silicide, or gate metals such as titanium, titanium nitride, tantalum, tantalum nitride, or aluminum. The first isolated well 205, the first source/drain regions 210, the second source/drain regions 211, and the gate 213 correspond to the body node 116, the first source/drain node 110, the second source/drain node 112, and the gate node 114 of the main NMOS transistor 108 of FIG. 1. The main NMOS transistor 208 may optionally include gate sidewall spacers 214 adjacent to the gate 213, as depicted in FIG. 2A.

The semiconductor device 200 also includes a well contact region 215 in the substrate 201 contacting the first isolated well 205. The well contact region 215 has the first conductivity type, and has a higher average dopant density than the first isolated well 205, to provide a low resistance connection to the first isolated well 205. The main NMOS transistor 208 and the well contact region 215 may be laterally separated by field oxide 216 at the top surface 202 of the substrate 201. The field oxide 216 may have a shallow trench isolation (STI) structure, as depicted in FIG. 2A, or may have a localized oxidation of silicon (LOCOS) structure.

Figure 2B:
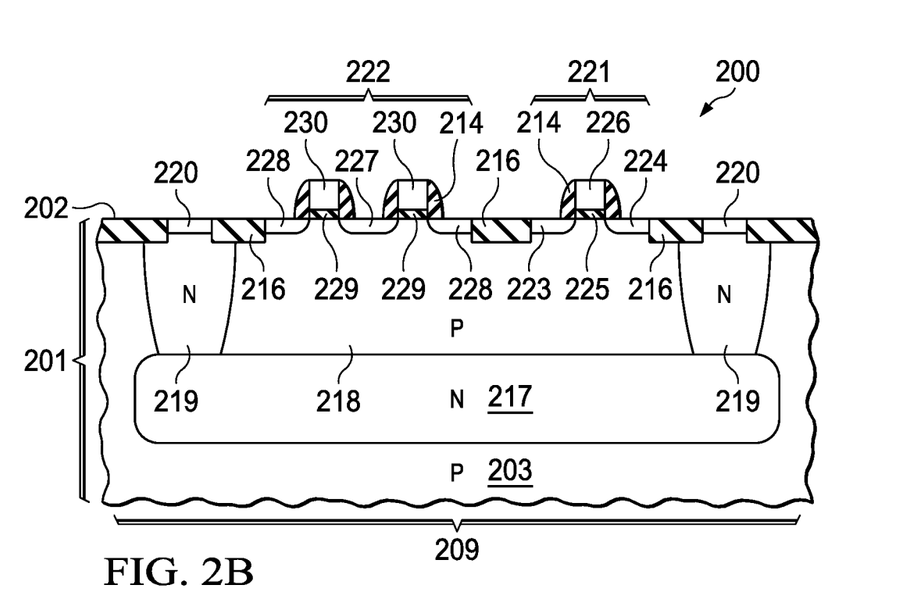

Referring to FIG. 2B, the semiconductor device 200 includes a second buried layer 217 in the substrate 201. The second buried layer 217 has the second conductivity type, which is n-type in this example. The second buried layer 217 may be separate from the first buried layer 204 of FIG. 2A, or may optionally be continuous with the first buried layer 204. The semiconductor device 200 includes a second isolated well 218 in the substrate 201, between the second buried layer 217 and the top surface 202. The second isolated well 218 has the first conductivity type. The second isolated well 218 is vertically isolated from the semiconductor material 203 by the second buried layer 217. The second isolated well 218 is laterally isolated from the semiconductor material 203 by a second isolation structure 219, manifested in this example as sinkers 219, in the substrate 201. The second isolated well 218 is separate from the first isolated well 205 of FIG. 2A. The semiconductor device 200 may include optional second sinker contact regions 220 that are heavily doped to provide low resistance connections to the second isolation structure 219. Other manifestations for the second isolation structure 219 are within the scope of this example. The semiconductor device 200 includes an electrical connection to the first buried layer 204 to enable a bias potential to be applied to the second buried layer 217 with respect to the semiconductor material 203, to provide a desired isolation of the second isolated well 218. In the instant example as depicted in FIG. 2B, the electrical connection to the second buried layer 217 is provided by the second isolation structure 219.

The semiconductor device 200 includes an upper control NMOS transistor 221 and an upper body bias NMOS transistor 222, both of which are parts of the bi-directional ESD structure 209. The upper control NMOS transistor 221 corresponds to the upper control NMOS transistor 118 of FIG. 1, and the upper body bias NMOS transistor 222 correspond to the upper body bias NMOS transistor 170 of FIG. 1. The second isolated well 218 provides a body region for the upper control NMOS transistor 221 and a body region for the upper body bias NMOS transistor 222. The upper control NMOS transistor 221 and the upper body bias NMOS transistor 222 may be laterally separated in the second isolated well 218 by the field oxide 216.

The upper control NMOS transistor 221 includes a drain node 223 and a source node 224 in the substrate 201. The drain node 223 and the source node 224 have the second conductivity type. The upper control NMOS transistor 221 includes a gate dielectric layer 225 on the top surface 202 of the substrate 201, and a gate 226 on the gate dielectric layer 225, partially overlapping the drain node 223 and the source node 224. The upper control NMOS transistor 221 may optionally include the gate sidewall spacers 214 adjacent to the gate 226. The second isolated well 218 and the drain node 223, the source node 224, and the gate 226 of the upper control NMOS transistor 221 correspond to the body node 126, the drain node 120, the source node 122, and the gate node 124 of the upper control NMOS transistor 118 of FIG. 1.

The upper body bias NMOS transistor 222 includes a drain node 227 and a source node 228 in the substrate 201. The drain node 227 and the source node 228 have the second conductivity type. The upper body bias NMOS transistor 222 includes a gate dielectric layer 229 on the top surface 202 of the substrate 201, and a gate 230 on the gate dielectric layer 229, partially overlapping the drain node 227 and the source node 228. The upper body bias NMOS transistor 222 may optionally include the gate sidewall spacers 214 adjacent to the gate 230. The second isolated well 218 and the drain node 227, the source node 228, and the gate 230 of the upper body bias NMOS transistor 222 correspond to the body node 180, the drain node 172, the source node 174, and the gate node 178 of the upper body bias NMOS transistor 170 of FIG. 1.

Figure 2C:
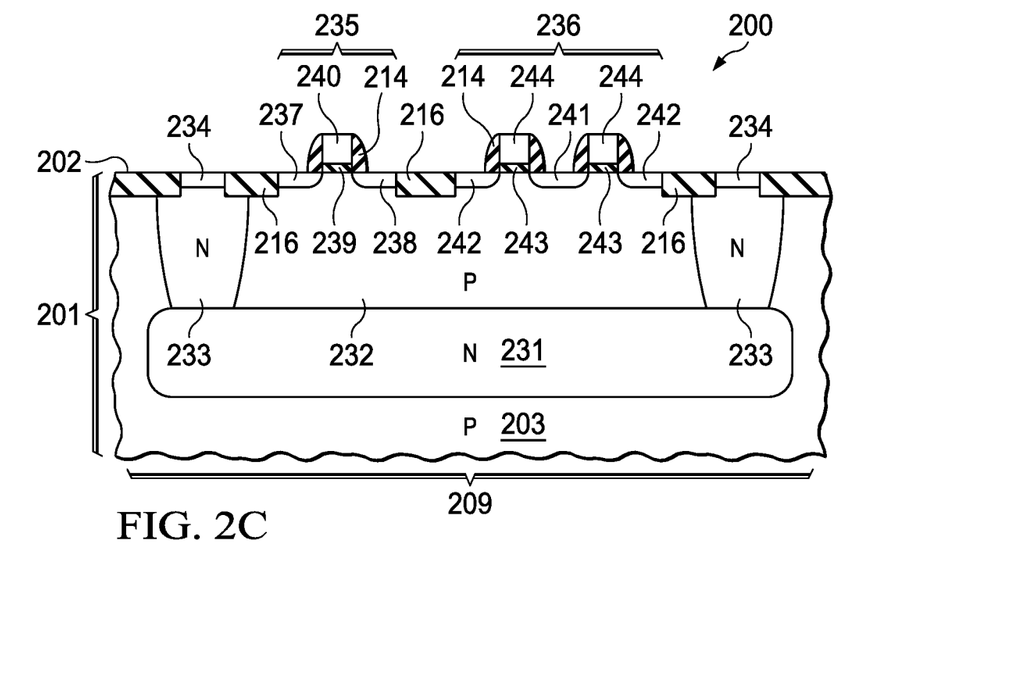

Referring to FIG. 2C, the semiconductor device 200 includes a third buried layer 231 in the substrate 201. The third buried layer 231 has the second conductivity type, which is n-type in this example. The third buried layer 231 may be separate from the first buried layer 204 of FIG. 2A and the second buried layer 217 of FIG. 2B, or may optionally be continuous with either of the first buried layer 204 or the second buried layer 217. The semiconductor device 200 includes a third isolated well 232 in the substrate 201, between the third buried layer 231 and the top surface 202. The third isolated well 232 has the first conductivity type. The third isolated well 232 is vertically isolated from the semiconductor material 203 by the third buried layer 231. The third isolated well 232 is laterally isolated from the semiconductor material 203 by a third isolation structure 233, manifested in this example as sinkers 233, in the substrate 201. The third isolated well 232 is separate from the first isolated well 205 of FIG. 2A and the second isolated well 218 of FIG. 2B. The semiconductor device 200 may include optional third sinker contact regions 234 that are heavily doped to provide low resistance connections to the third isolation structure 233. Other manifestations for the third isolation structure 233, such as deep trenches, are within the scope of this example. The semiconductor device 200 includes an electrical connection to the third buried layer 231 to enable a bias potential to be applied to the third buried layer 231 with respect to the semiconductor material 203, to provide a desired isolation of the third isolated well 232. In the instant example as depicted in FIG. 2C, the electrical connection to the third buried layer 231 is provided by the third isolation structure 233.

The semiconductor device 200 includes a lower control NMOS transistor 235 and a lower body bias NMOS transistor 236, both of which are parts of the bi-directional ESD structure 209. The lower control NMOS transistor 235 corresponds to the lower control NMOS transistor 128 of FIG. 1, and the lower body bias NMOS transistor 236 correspond to the lower body bias NMOS transistor 182 of FIG. 1. The third isolated well 232 provides a body region for the lower control NMOS transistor 235 and a body region for the lower body bias NMOS transistor 236. The lower control NMOS transistor 235 and the lower body bias NMOS transistor 236 may be laterally separated in the third isolated well 232 by the field oxide 216.

The lower control NMOS transistor 235 includes a drain node 237 and a source node 238 in the substrate 201. The drain node 237 and the source node 238 have the second conductivity type. The lower control NMOS transistor 235 includes a gate dielectric layer 239 on the top surface 202 of the substrate 201, and a gate 240 on the gate dielectric layer 239, partially overlapping the drain node 237 and the source node 238. The lower control NMOS transistor 235 may optionally include the gate sidewall spacers 214 adjacent to the gate 240. The third isolated well 232 and the drain node 237, the source node 238, and the gate 240 of the lower control NMOS transistor 235 correspond to the body node 136, the drain node 130, the source node 132, and the gate node 134 of the lower control NMOS transistor 128 of FIG. 1.

The lower body bias NMOS transistor 236 includes a drain node 241 and a source node 242 in the substrate 201. The drain node 241 and the source node 242 have the second conductivity type. The lower body bias NMOS transistor 236 includes a gate dielectric layer 243 on the top surface 202 of the substrate 201, and a gate 244 on the gate dielectric layer 243, partially overlapping the drain node 241 and the source node 242. The lower body bias NMOS transistor 236 may optionally include the gate sidewall spacers 214 adjacent to the gate 244. The third isolated well 232 and the drain node 241, the source node 242, and the gate 244 of the lower body bias NMOS transistor 236 correspond to the body node 192, the drain node 184, the source node 186, and the gate node 190 of the lower body bias NMOS transistor 182 of FIG. 1.

Figure 2D:
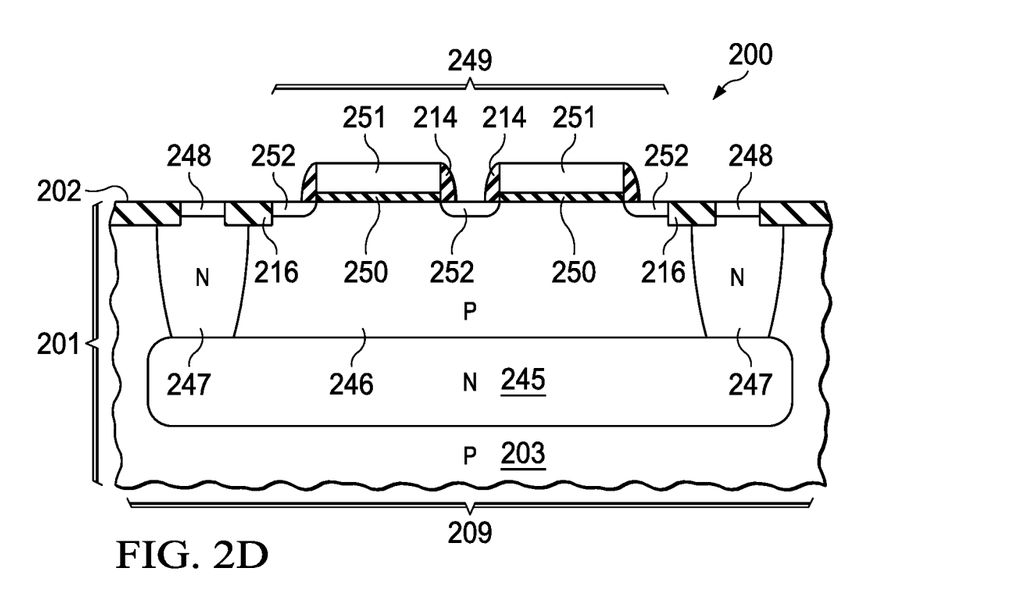

Referring to FIG. 2D, the semiconductor device 200 includes a fourth buried layer 245 in the substrate 201. The fourth buried layer 245 has the second conductivity type, which is n-type in this example. The fourth buried layer 245 may be separate from the first buried layer 204 of FIG. 2A, the second buried layer 217 of FIG. 2B, and the third buried layer 231 of FIG. 2C, or may optionally be continuous with any of the first buried layer 204, the second buried layer 217, or the third buried layer 231. The semiconductor device 200 includes a fourth isolated well 246 in the substrate 201, between the fourth buried layer 245 and the top surface 202. The fourth isolated well 246 has the first conductivity type. The fourth isolated well 246 is vertically isolated from the semiconductor material 203 by the fourth buried layer 245. The fourth isolated well 246 is laterally isolated from the semiconductor material 203 by a fourth isolation structure 247, manifested in this example as sinkers 247, in the substrate 201. The fourth isolated well 246 is separate from the first isolated well 205 of FIG. 2A, the second isolated well 218 of FIG. 2B, and the third isolated well 232 of FIG. 2C. The semiconductor device 200 may include optional fourth sinker contact regions 248 that are heavily doped to provide low resistance connections to the fourth isolation structure 247. Other manifestations for the fourth isolation structure 247, such as deep trenches, are within the scope of this example. The semiconductor device 200 includes an electrical connection to the fourth buried layer 245 to enable a bias potential to be applied to the fourth buried layer 245 with respect to the semiconductor material 203, to provide a desired isolation of the fourth isolated well 246. In the instant example as depicted in FIG. 2D, the electrical connection to the fourth buried layer 245 is provided by the fourth isolation structure 247.

The semiconductor device 200 includes an upper capacitor 249 which is part of the bi-directional ESD structure 209. The upper capacitor 249 corresponds to the upper capacitor 154 of FIG. 1. The upper capacitor 249 includes an upper dielectric layer 250 on the top surface 202 of the substrate 201. The upper dielectric layer 250 may have a composition and thickness similar to any of the gate dielectric layer 212 of the main NMOS transistor 208 of FIG. 2A, the gate dielectric layer 225 of the upper control NMOS transistor 221 of FIG. 2B, the gate dielectric layer 229 of the upper body bias NMOS transistor 222 of FIG. 2B, the gate dielectric layer 239 of the lower control NMOS transistor 235 of FIG. 2C, or the gate dielectric layer 243 of the lower body bias NMOS transistor 236 of FIG. 2C, as a result of being formed concurrently, which may advantageously reduce fabrication cost and complexity for the semiconductor device 200. The upper capacitor 249 includes a first plate 251 on the upper dielectric layer 250. The first plate 251 may have a composition and thickness similar to any of the gate 213 of the main NMOS transistor 208 of FIG. 2A, the gate 226 of the upper control NMOS transistor 221 of FIG. 2B, the gate 230 of the upper body bias NMOS transistor 222 of FIG. 2B, the gate 240 of the lower control NMOS transistor 235 of FIG. 2C, or the gate 244 of the lower body bias NMOS transistor 236 of FIG. 2C, as a result of being formed concurrently, which may further reduce fabrication cost and complexity for the semiconductor device 200. The upper capacitor 249 may optionally include the gate sidewall spacers 214 adjacent to the first plate 251. The fourth isolated well 246 under the first plate 251 provides a second plate of the upper capacitor 249. The semiconductor device 200 may also include a well contact region 252 in the substrate 201 adjacent to the first plate 251, contacting the fourth isolated well 246. The well contact region 252 has the first conductivity type, and has a higher average dopant density than the fourth isolated well 246, to provide a low resistance connection to the fourth isolated well 246. The fourth isolated well 246, and the first plate 251 of the upper capacitor 249 correspond to the upper second plate 158 and the upper first plate 156 of the upper capacitor 154 of FIG. 1.

Other manifestations for the upper capacitor 249 are within the scope of this example. For example, the upper capacitor 249 may be manifested as a metal-insulator-metal (MIM) capacitor in an interconnect region of the semiconductor device 200. Alternatively, the upper capacitor 249 may be manifested as a gate capacitor with an isolated n-type well providing the second plate of the upper capacitor 249.

Figure 2E:
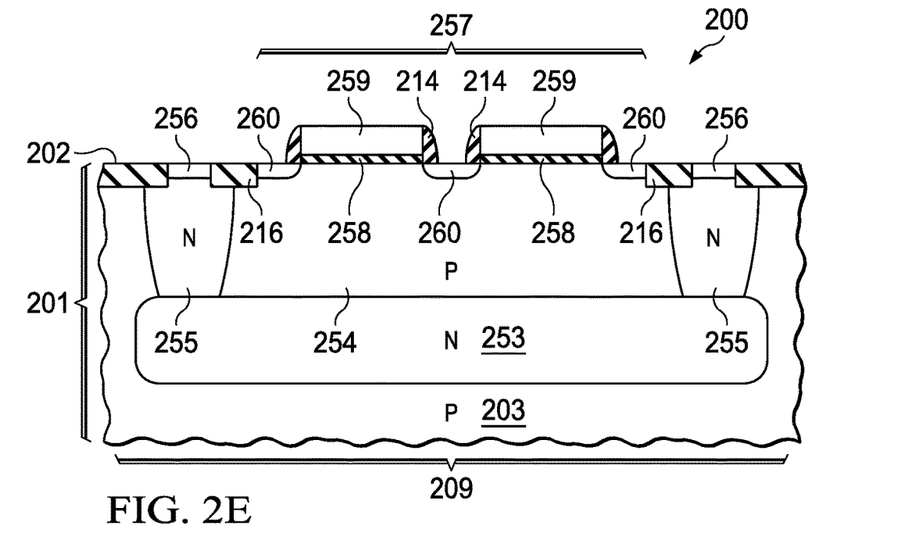

Referring to FIG. 2E, the semiconductor device 200 includes a fifth buried layer 253 in the substrate 201. The fifth buried layer 253 has the second conductivity type, which is n-type in this example. The fifth buried layer 253 may be separate from the first buried layer 204 of FIG. 2A, the second buried layer 217 of FIG. 2B, the third buried layer 231 of FIG. 2C, and the fourth buried layer 245 of FIG. 2D, or may optionally be continuous with any of the first buried layer 204, the second buried layer 217, the third buried layer 231, or the fourth buried layer 245. The semiconductor device 200 includes a fifth isolated well 254 in the substrate 201, between the fifth buried layer 253 and the top surface 202. The fifth isolated well 254 has the first conductivity type. The fifth isolated well 254 is vertically isolated from the semiconductor material 203 by the fifth buried layer 253. The fifth isolated well 254 is laterally isolated from the semiconductor material 203 by a fifth isolation structure 255, manifested in this example as sinkers 255, in the substrate 201. The fifth isolated well 254 is separate from the first isolated well 205 of FIG. 2A, the second isolated well 218 of FIG. 2B, the third isolated well 232 of FIG. 2C, and the fourth isolated well 246 of FIG. 2D. The semiconductor device 200 may include optional fifth sinker contact regions 256 that are heavily doped to provide low resistance connections to the fifth isolation structure 255. Other manifestations for the fifth isolation structure 255, such as deep trenches, are within the scope of this example. The semiconductor device 200 includes an electrical connection to the fifth buried layer 253 to enable a bias potential to be applied to the fifth buried layer 253 with respect to the semiconductor material 203, to provide a desired isolation of the fifth isolated well 254. In the instant example as depicted in FIG. 2E, the electrical connection to the fifth buried layer 253 is provided by the fifth isolation structure 255.

The semiconductor device 200 includes a lower capacitor 257 which is part of the bi-directional ESD structure 209. The lower capacitor 257 corresponds to the lower capacitor 162 of FIG. 1. The lower capacitor 257 includes a lower dielectric layer 258 on the top surface 202 of the substrate 201. The lower dielectric layer 258 may have a composition and thickness similar to any of the gate dielectric layer 212 of the main NMOS transistor 208 of FIG. 2A, the gate dielectric layer 225 of the upper control NMOS transistor 221 of FIG. 2B, the gate dielectric layer 229 of the upper body bias NMOS transistor 222 of FIG. 2B, the gate dielectric layer 239 of the lower control NMOS transistor 235 of FIG. 2C, or the gate dielectric layer 243 of the lower body bias NMOS transistor 236 of FIG. 2C, as a result of being formed concurrently, accruing the advantage described in reference to the upper dielectric layer 250 of the upper capacitor 249 of FIG. 2D. The lower capacitor 257 includes a first plate 259 on the lower dielectric layer 258. The first plate 259 may have a composition and thickness similar to any of the gate 213 of the main NMOS transistor 208 of FIG. 2A, the gate 226 of the upper control NMOS transistor 221 of FIG. 2B, the gate 230 of the upper body bias NMOS transistor 222 of FIG. 2B, the gate 240 of the lower control NMOS transistor 235 of FIG. 2C, or the gate 244 of the lower body bias NMOS transistor 236 of FIG. 2C, as a result of being formed concurrently, accruing the advantage described in reference to the first plate 251 of the upper capacitor 249 of FIG. 2D. The lower capacitor 257 may optionally include the gate sidewall spacers 214 adjacent to the first plate 259. The fifth isolated well 254 provides a second plate of the lower capacitor 257. The semiconductor device 200 may also include a well contact region 260 in the substrate 201 adjacent to the first plate 259, contacting the fifth isolated well 254. The well contact region 260 has the first conductivity type, and has a higher average dopant density than the fifth isolated well 254, to provide a low resistance connection to the fifth isolated well 254. The fifth isolated well 254, and the first plate 259 of the lower capacitor 257 correspond to the lower second plate 166 and the lower first plate 164 of the lower capacitor 162 of FIG. 1. Other manifestations for the lower capacitor 257 are within the scope of this example.

Figure 2F:
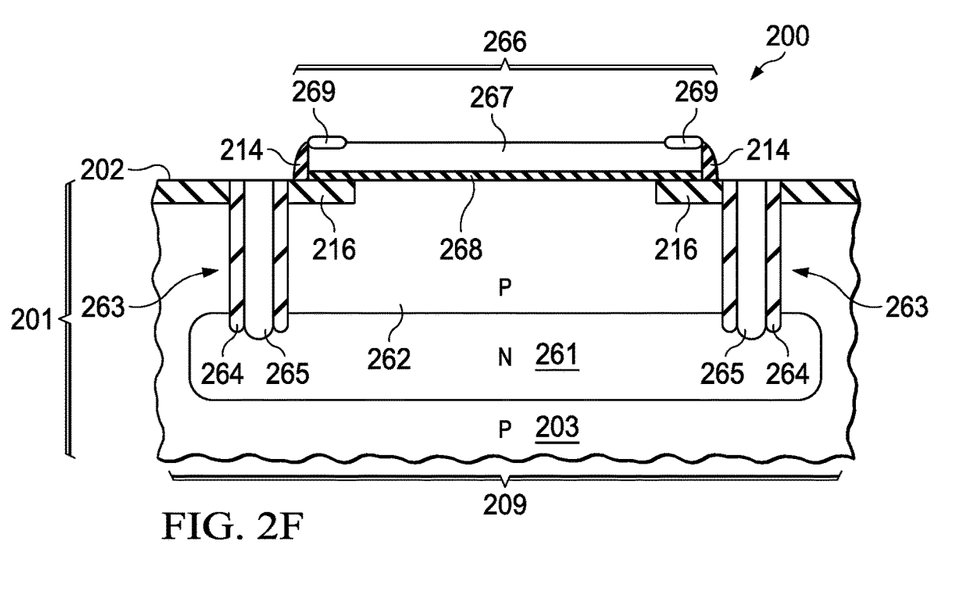

Referring to FIG. 2F, the semiconductor device 200 may optionally include a sixth buried layer 261 in the substrate 201. The sixth buried layer 261 has the second conductivity type, which is n-type in this example. The sixth buried layer 261 may be separate from the first buried layer 204 of FIG. 2A, the second buried layer 217 of FIG. 2B, the third buried layer 231 of FIG. 2C, the fourth buried layer 245 of FIG. 2D, and the fifth buried layer 253 of FIG. 2E, or may optionally be continuous with any of the first buried layer 204, the second buried layer 217, the third buried layer 231, the fourth buried layer 245, or the fifth buried layer 253. The semiconductor device 200 includes a sixth isolated well 262 in the substrate 201, between the sixth buried layer 261 and the top surface 202. The sixth isolated well 262 has the first conductivity type. The sixth isolated well 262 is vertically isolated from the semiconductor material 203 by the sixth buried layer 261. The sixth isolated well 262 is laterally isolated from the semiconductor material 203 by a sixth isolation structure 263 in the substrate 201. The sixth isolation structure 263 may be manifested as a deep trench 263, with a silicon dioxide liner 264 contacting the sixth isolated well 262 and a polycrystalline silicon core 265 inside the silicon dioxide liner 264. The polycrystalline silicon core 265 may provide an electrical connection to the sixth buried layer 261, as indicated in FIG. 2F. The sixth isolated well 262 is separate from the first isolated well 205 of FIG. 2A, the second isolated well 218 of FIG. 2B, the third isolated well 232 of FIG. 2C, the fourth isolated well 246 of FIG. 2D, and the fifth isolated well 254 of FIG. 2E. The electrical connection to the sixth buried layer 261 enables a bias potential to be applied to the sixth buried layer 261 with respect to the semiconductor material 203, to provide a desired isolation of the sixth isolated well 262.

The semiconductor device 200 includes an upper resistor 266 which is part of the bi-directional ESD structure 209. The upper resistor 266 corresponds to the upper resistor 160 of FIG. 1. The upper resistor 266 includes a resistor body 267. In this example, the resistor body 267 may be located outside of the substrate 201, on an isolation layer 268 on the top surface 202 of the substrate 201. The upper resistor 266 may optionally include the gate sidewall spacers 214 adjacent to the resistor body 267. The resistor body 267 may have a composition and thickness similar to any of the gate 213 of the main NMOS transistor 208 of FIG. 2A, the gate 226 of the upper control NMOS transistor 221 of FIG. 2B, the gate 230 of the upper body bias NMOS transistor 222 of FIG. 2B, the gate 240 of the lower control NMOS transistor 235 of FIG. 2C, or the gate 244 of the lower body bias NMOS transistor 236 of FIG. 2C, as a result of being formed concurrently, accruing the advantage described in reference to the first plate 251 of the upper capacitor 249 of FIG. 2D. The isolation layer 268 may have a composition and thickness similar to any of the gate dielectric layer 212 of the main NMOS transistor 208 of FIG. 2A, the gate dielectric layer 225 of the upper control NMOS transistor 221 of FIG. 2B, the gate dielectric layer 229 of the upper body bias NMOS transistor 222 of FIG. 2B, the gate dielectric layer 239 of the lower control NMOS transistor 235 of FIG. 2C, or the gate dielectric layer 243 of the lower body bias NMOS transistor 236 of FIG. 2C, as a result of being formed concurrently, accruing the advantage described in reference to the upper dielectric layer 250 of the upper capacitor 249 of FIG. 2D.

The upper resistor 266 may optionally include metal silicide 269 on ends of the resistor body 267 to provide low resistance connection to the resistor body 267. The upper resistor 266 may optionally include field oxide 216 under ends of the resistor body 267 to reduce punch-through defects during subsequent contact etching over the ends of the resistor body 267.

Other manifestations for the upper resistor 266 are within the scope of this example. For example, the upper resistor 266 may be manifested as a thin film resistor including silicon chromium in the interconnect region of the semiconductor device 200. Alternatively, the upper resistor 266 may be manifested as a well resistor in the substrate 201.

The semiconductor device 200 further includes a lower resistor, an upper body bias resistor, and a lower body bias resistor, not shown in FIG. 2F, which are all parts of the bi-directional ESD structure 209. The lower resistor, the upper body bias resistor, and the lower body bias resistor all have structures similar to the upper resistor 266. The lower resistor corresponds to the lower resistor 168 of FIG. 1. The upper body bias resistor corresponds to the upper body bias resistor 176 of FIG. 1. The lower body bias resistor corresponds to the lower body bias resistor 188 of FIG. 1. The upper resistor 266 and the lower resistor may have similar resistance values. The upper body bias resistor and the lower body bias resistor may have similar resistance values. The lower resistor, the upper body bias resistor, and the lower body bias resistor may be located over the sixth isolated well 262, or may be located over other isolated wells. Alternatively, the upper resistor 266, the lower resistor, the upper body bias resistor, and the lower body bias resistor may be located over other portions of the substrate 201. In other versions of this example, the upper resistor 266, the lower resistor, the upper body bias resistor, and the lower body bias resistor may be manifested as thin film resistors of silicon chromium or the like, located outside of the substrate 201, or well resistors in the substrate 201.

The first isolation structure 206 of FIG. 2A, the second isolation structure 219 of FIG. 2B, the third isolation structure 233 of FIG. 2C, the fourth isolation structure 247 of FIG. 2D, the fifth isolation structure 255 of FIG. 2E, and the sixth isolation structure 263, as well as isolation structures around isolated wells under the lower resistor, the upper body bias resistor, and the lower body bias resistor, may have similar structures. The examples depicted in FIG. 2A through FIG. 2F depict more than one type of isolation structure, to illustrate possible alternatives, however, in practice forming all the isolation structures concurrently with similar structures may advantageously reduce fabrication cost and complexity for the semiconductor device 200. Any combination of the first isolation structure 206, the second isolation structure 219, the third isolation structure 233, the fourth isolation structure 247, the fifth isolation structure 255, and the sixth isolation structure 263, as well as isolation structures around isolated wells under the lower resistor, the upper body bias resistor, and the lower body bias resistor, may be continuous, or joined, to advantageously reduce an area of the bi-directional ESD structure 209.

Figure 3:
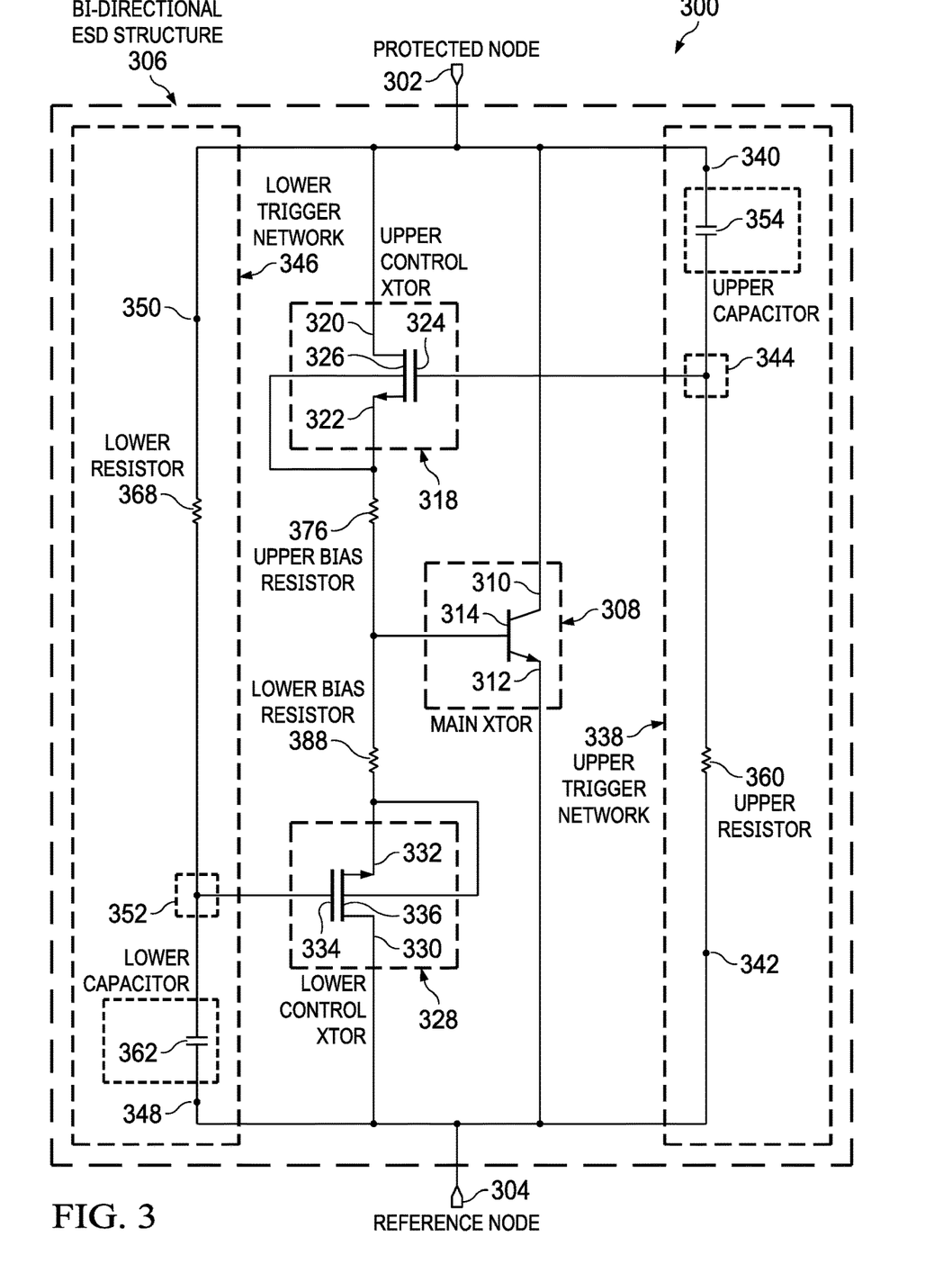
FIG. 3 is a circuit diagram of another example semiconductor device having a bi-directional ESD structure.

FIG. 3 is a circuit diagram of another example semiconductor device having a bi-directional ESD structure. The semiconductor device 300 has a protected node 302 and a reference node 304. The semiconductor device 300 includes the bi-directional ESD structure 306, which is electrically coupled to the protected node 302 and the reference node 304.

The bi-directional ESD structure 306 includes a main transistor 308. In this example, the main transistor 308 is manifested as a main NPN BJT 308. The main NPN BJT 308 includes a first ESD current node 310 electrically coupled to the protected node 302, and a second ESD current node 312 electrically coupled to the protected node 304. In this example, the first ESD current node 310 is manifested as a first emitter/collector node 310 of the main NPN BJT 308, and the second ESD current node 312 is manifested as a second emitter/collector node 312 of the main NPN BJT 308. The main NPN BJT 308 also includes an ESD control node 314, which is manifested as a base node 314 of the main NPN BJT 308.

The bi-directional ESD structure 306 includes an upper control transistor 318, which is manifested as an upper control NMOS transistor 318 in this example. The upper control NMOS transistor 318 includes a first upper current node 320 electrically coupled to the protected node 302. In this example, the first upper current node 320 is manifested as a drain node 320 of the upper control NMOS transistor 318. The upper control NMOS transistor 318 includes a second upper current node 322 electrically coupled to the base node 314 of the main NPN BJT 308 through an upper bias resistor 376. In this example, the second upper current node 322 is manifested as a source node 322 of the upper control NMOS transistor 318. The upper control NMOS transistor 318 also includes an upper control node 324, manifested as a gate node 324 of the upper control NMOS transistor 318, in this example. The upper control NMOS transistor 318 includes a body node 326, which is connected to the source node 322.

The bi-directional ESD structure 306 includes a lower control transistor 328, which is manifested as a lower control NMOS transistor 328 in this example. The lower control NMOS transistor 328 includes a first lower current node 330 electrically coupled to the reference node 304. In this example, the first lower current node 330 is manifested as a drain node 330 of the lower control NMOS transistor 328. The lower control NMOS transistor 328 includes a second lower current node 332 electrically coupled to the base node 314 of the main NPN BJT 308. In this example, the second lower current node 332 is manifested as a source node 332 of the lower control NMOS transistor 328. The lower control NMOS transistor 328 also includes a lower control node 334, manifested as a gate node 334 of the lower control NMOS transistor 328, in this example. The lower control NMOS transistor 328 further includes a body node 336, which is connected to the source node 332.

The bi-directional ESD structure 306 includes an upper trigger network 338 electrically coupled between the protected node 302 and the reference node 304. The upper trigger network 338 includes an upper input node 340 electrically coupled to the protected node 302, and an upper relaxation node 342 electrically coupled to the reference node 304. The upper trigger network 338 further includes an upper trigger node 344 electrically coupled to the gate node 324 of the upper control NMOS transistor 318. In this example, the upper trigger network 338 includes an upper capacitor 354 and an upper resistor 360. The upper capacitor 354 is electrically coupled between the upper input node 340 and the upper trigger node 344. The upper resistor 360 is electrically coupled between the upper trigger node 344 and the upper relaxation node 342. The upper trigger network 338 is configured to provide a transient on-state signal at the upper trigger node 344 from a positive electrical pulse on the protected node 302 relative to the reference node 304, as disclosed in reference to the upper trigger network 138 of FIG. 1.

The bi-directional ESD structure 306 includes a lower trigger network 346 electrically coupled between the protected node 302 and the reference node 304. The lower trigger network 346 includes a lower input node 348 electrically coupled to the reference node 304, and a lower relaxation node 350 electrically coupled to the protected node 302. The lower trigger network 346 further includes a lower trigger node 352 electrically coupled to the gate node 334 of the lower control NMOS transistor 328. In this example, the lower trigger network 346 includes a lower capacitor 362 and a lower resistor 368. The lower capacitor 362 is electrically coupled between the lower input node 348 and the lower trigger node 352. The lower resistor 368 is electrically coupled between the lower trigger node 352 and the lower relaxation node 350. The lower trigger network 346 is configured to provide a transient on-state signal at the lower trigger node 352 from a negative electrical pulse on the protected node 302 relative to the reference node 304, as disclosed in reference to the lower trigger network 146 of FIG. 1.

When the semiconductor device 300 is unpowered, the main NPN BJT 308, the upper control NMOS transistor 318 and the lower control NMOS transistor 328 are in off states, that is, no currents flow through the main NPN BJT 308, the upper control NMOS transistor 318, or the lower control NMOS transistor 328. A transient on-state signal at the upper trigger node 344, generated by a positive electrical pulse on the protected node 302 relative to the reference node 304, turns on the upper control NMOS transistor 318. The lower control NMOS transistor 328 remains in an off state. The positive electrical pulse on the protected node 302 causes current to flow from the protected node 302 through the upper control NMOS transistor 318 and the upper bias resistor 376, biasing the base node 314 of the main NPN BJT 308 to an on-state potential relative to the second emitter/collector node 312, and turning on the main NPN BJT 308. In this case, the second emitter/collector node 312 functions as an emitter node of the main NPN BJT 308. Current subsequently flows through the main NPN BJT 308 from the protected node 302 to the reference node 304, reducing a potential difference between the protected node 302 and the reference node 304. The main NPN BJT 308 may have a lower resistance than an NMOS transistor having a same area, advantageously reducing the potential difference more quickly.

A negative electrical pulse on the protected node 302 relative to the reference node 304 is reduced by a similar process. A transient on-state signal at the lower trigger node 352, generated by the negative electrical pulse on the protected node 302 relative to the reference node 304, turns on the lower control NMOS transistor 328. The upper control NMOS transistor 318 remains in an off state. The negative electrical pulse on the protected node 302 causes current to flow from the reference node 304 through the lower control NMOS transistor 328 and the lower bias resistor 388, biasing the base node 314 of the main NPN BJT 308 to an on-state potential relative to the first emitter/collector node 310 of the main NPN BJT 308, and turning on the main NPN BJT 308. In this case, the first emitter/collector node 310 functions as an emitter node of the main NPN BJT 308. Current subsequently flows through the main NPN BJT 308 from the reference node 304 to the protected node 302, reducing a potential difference between the protected node 302 and the reference node 304. Additional instances of the bi-directional ESD structure 306 may be included in the semiconductor device 300 to protect additional I/O pads.

Figure 4:
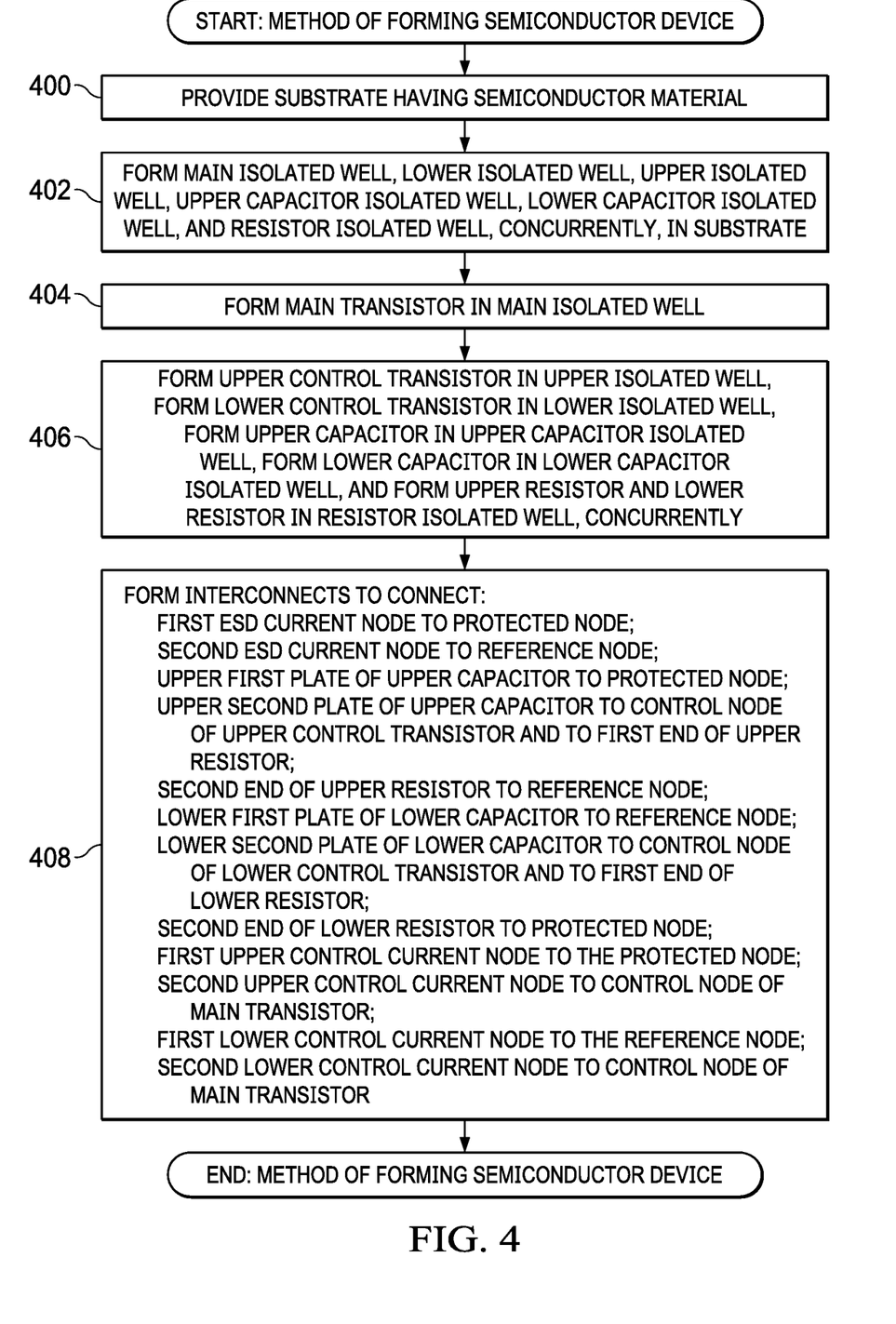
FIG. 4 is a flow chart disclosing an example method of forming a semiconductor device having a bi-directional ESD structure.

FIG. 4 is a flow chart disclosing an example method of forming a semiconductor device having a bi-directional ESD structure. The method begins with step 400, which is to provide a substrate having a semiconductor material with a first conductivity type. The substrate may be implemented as part of a semiconductor wafer, such as a bulk wafer or a wafer having an epitaxial layer.

The method continues with step 402, which is to form a main isolated well, a lower isolated well, an upper isolated well, an upper capacitor isolated well, a lower capacitor isolated well, and a resistor isolated well, referred to as the isolated wells, concurrently, in the substrate. The isolated wells are parts of the bi-directional ESD structure. The isolated wells may be formed by forming a buried layer in the substrate having a second conductivity type, opposite from the first conductivity type. The buried layer may extend below areas for the isolated wells. An epitaxial layer having the first conductivity type may subsequently be formed over the buried layer to provide a semiconductor material for the isolated wells. Isolation structures may be formed through the epitaxial layer to laterally isolate the isolated wells from surrounding semiconductor material. The isolation structures may be formed by implanting dopants of the second conductivity type as the buried layer, followed by a thermal drive operation to diffuse the dopants to the buried layer, forming sinkers around the isolated wells. Alternatively, the isolation structures may be formed by etching deep trenches through the epitaxial layer to the buried layer, and forming dielectric material such as silicon dioxide in the deep trenches. A center region of the deep trenches may be filled with polycrystalline silicon, on the dielectric material. The isolation structures may be formed to be continuous, with adjacent isolated wells sharing a portion of the isolation structures along a common boundary, to reduce an area of the bi-directional ESD structure.

The method continues with step 404, which is to form a main transistor of the bi-directional ESD structure in the main isolated well. The main transistor may be formed as an NMOS transistor, as a p-channel metal oxide semiconductor (PMOS) transistor, as an NPN BJT, or as a PNP BJT. The main transistor is formed to have a first ESD current node, a second ESD current node, and an ESD control node. When the main transistor is implemented as an NMOS transistor or a PMOS transistor, the first ESD current node is formed as a first source/drain node in the substrate, the second ESD current node is formed as a second source/drain node in the substrate, and the ESD control node is formed as a gate node over the substrate. When the main transistor is implemented as an NPN BJT or a PNP BJT, the first ESD current node is formed as a first emitter/collector node in the substrate, the second ESD current node is formed as a second emitter/collector node in the substrate, and the ESD control node is formed as a base node in the substrate.

The method continues with step 406, which is to concurrently form an upper control transistor in the upper isolated well, form a lower control transistor in the lower isolated well, form an upper capacitor in the upper capacitor isolated well, form a lower capacitor in the lower capacitor isolated well, and form an upper resistor and a lower resistor in the resistor isolated well, concurrently. The upper control transistor, the lower control transistor, the upper capacitor, the lower capacitor, the upper resistor, and the lower resistor are parts of the bi-directional ESD structure. The upper control transistor, and the lower control transistor may be formed as NMOS transistors or PMOS transistors. The upper capacitor and the lower capacitor may be formed as gate oxide capacitors, in which first plates of the upper capacitor and the lower capacitor are provided by gate material layers formed concurrently with gates of the upper control transistor, and the lower control transistor. Capacitor dielectric layers of the upper capacitor and the lower capacitor are provided by gate dielectric layers formed on a top surface of the upper capacitor isolated well and the lower capacitor isolated well, concurrently with gate dielectric layers of the upper control transistor, and the lower control transistor. Second plates of the upper capacitor and the lower capacitor are provided by the upper capacitor isolated well and the lower capacitor isolated well, respectively. The upper resistor and the lower resistor may be formed as gate material resistors, formed concurrently with the gates of the upper control transistor, and the lower control transistor. Step 406 may be performed concurrently with step 404, advantageously reducing fabrication cost and complexity of the semiconductor device.

The method continues with step 408, which is to form interconnects over the substrate, to couple components of the bi-directional ESD structure. The interconnects are formed to provide a protected node of the semiconductor device and a reference node of the semiconductor device. The interconnects are formed to couple the first ESD current node of the main transistor to the protected node, and to couple the second ESD current node of the main transistor to the reference node. The interconnects are formed to couple the upper capacitor between the protected node and the upper resistor, and to couple the upper resistor between the upper capacitor and the reference node, the connection between the upper capacitor and the upper resistor providing an upper trigger node. The interconnects are formed to couple the lower capacitor between the reference node and the lower resistor, and to couple the lower resistor between the lower capacitor and the protected node, the connection between the lower capacitor and the lower resistor providing a lower trigger node. The interconnects are formed to couple the upper trigger node to a control node of the upper control transistor, to couple a first upper current node of the upper control transistor to the protected node, and to couple a second upper current node of the upper control transistor to the control node of the main transistor. The interconnects are formed to couple the lower trigger node to a control node of the lower control transistor, to couple a first lower current node of the lower control transistor to the reference node, and to couple a second lower current node of the lower control transistor to the control node of the main transistor.

Additional components of the bi-directional ESD structure may be formed to implement the semiconductor device according to the circuit diagram of FIG. 1 or the circuit diagram of FIG. 3. The semiconductor device may subsequently be singulated from a wafer containing the semiconductor device, and may further be assembled into a device package.

It is noted that terms such as top, over, overlapping, under, and below may be used in this disclosure. These terms should not be construed as limiting the position or orientation of a structure or element, but should be used to provide spatial relationship between structures or elements.

For the purposes of this disclosure, the term "dopants of a first conductivity type" and the term "dopants of a second conductivity type" are understood to mean dopants which provide the first conductivity type and dopants which provide the second conductivity type, respectively, in a semiconductor material.

In the semiconductor industry, a well comprising the same conductivity type as the substrate is sometimes referred to as merely the substrate and not a well at all; the well has the same majority charge carriers as the substrate. As used herein, however, the term "well" is intended to mean either an n-type well or a p-type well, and includes even a well that may comprise the same conductivity type as the substrate.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
a protected node;
a reference node;
a substrate including a semiconductor material; and
a bi-directional electrostatic discharge (ESD) structure electrically coupled to the reference node and the protected node, the bi-directional ESD structure including:
a main transistor including a first ESD current node in the substrate, electrically coupled to the protected node, a second ESD current node in the substrate, electrically coupled to the reference node, and an ESD control node;
an upper control transistor including a first upper current node in the substrate, electrically coupled to the protected node, a second upper current node in the substrate, electrically coupled to the ESD control node, and an upper control node;
a lower control transistor including a first lower current node in the substrate, electrically coupled to the reference node, a second lower current node in the substrate, electrically coupled to the ESD control node, and a lower control node;
an upper trigger network including an upper input node electrically coupled to the protected node, an upper relaxation node electrically coupled to the reference node, and an upper trigger node electrically coupled to the upper control node, the upper trigger network being configured to provide a first transient on-state signal at the upper trigger node from a positive electrical pulse on the protected node relative to the reference node; and
a lower trigger network including a lower input node electrically coupled to the reference node, a lower relaxation node electrically coupled to the protected node, and a lower trigger node electrically coupled to the lower control node, the lower trigger network being configured to provide a second transient on-state signal at the lower trigger node from a negative electrical pulse on the protected node relative to the reference node.

2. The semiconductor device of claim 1, wherein the main transistor is located in an isolated well in the substrate, and isolated from upper control transistor and the lower control transistor.

3. The semiconductor device of claim 1, wherein:
the upper trigger network includes:
an upper capacitor having an upper first plate electrically coupled to the protected node, and an upper second plate electrically coupled to the upper trigger node; and
an upper resistor electrically coupling the upper trigger node to the upper relaxation node; and
the lower trigger network includes:
a lower capacitor having a lower first plate electrically coupled to the reference node, and a lower second plate electrically coupled to the lower trigger node; and
a lower resistor electrically coupling the lower trigger node to the lower relaxation node.

4. The semiconductor device of claim 3, wherein:
the upper first plate includes gate material having a composition similar to a gate in a transistor of the semiconductor device;
the upper second plate includes a region of the semiconductor material under the upper first plate;
the upper capacitor includes an upper dielectric layer, the upper dielectric layer having a composition similar to a gate dielectric layer in the transistor;
the lower first plate includes gate material having a composition similar to a gate in the transistor;
the lower second plate includes a region of the semiconductor material under the lower first plate; and
the lower capacitor includes a lower dielectric layer, the lower dielectric layer having a composition similar to a gate dielectric layer in the transistor.

5. The semiconductor device of claim 4, wherein the upper second plate is in an upper capacitor isolated well in the substrate, and the lower second plate is in a lower capacitor isolated well in the substrate, the lower capacitor isolated well being separate from the upper capacitor isolated well.

6. The semiconductor device of claim 3, wherein the upper resistor and the lower resistor include gate material having a composition similar to a gate in a transistor of the semiconductor device.

7. The semiconductor device of claim 1, wherein:
the upper control transistor is an upper control n-channel metal oxide semiconductor (NMOS) transistor;
the first upper current node of the upper control transistor includes a drain node of the upper control NMOS transistor;
the second upper current node of the upper control transistor includes a source node of the upper control NMOS transistor;
the upper control node of the upper control transistor includes a gate node of the upper control NMOS transistor;
the lower control transistor is a lower control NMOS transistor;
the first lower current node of the lower control transistor includes a drain node of the lower control NMOS transistor;
the second lower current node of the lower control transistor includes a source node of the lower control NMOS transistor; and
the lower control node of the lower control transistor includes a gate node of the lower control NMOS transistor.

8. The semiconductor device of claim 1, wherein:
the main transistor is a main NMOS transistor;
the first ESD current node includes a first source/drain node of the main NMOS transistor;
the second ESD current node includes a second source/drain node of the main NMOS transistor; and
the ESD control node includes a gate node of the main NMOS transistor; and
the bi-directional ESD structure further includes:
an upper body bias transistor including a first upper body bias current node electrically coupled to the protected node, a second upper body bias current node electrically coupled to a body node of the main NMOS transistor, and an upper body bias control node electrically coupled to the upper trigger node; and
a lower body bias transistor including a first lower body bias current node electrically coupled to the reference node, a second lower body bias current node electrically coupled to the body node of the main NMOS transistor, and a lower body bias control node electrically coupled to the lower trigger node.

9. The semiconductor device of claim 8, wherein:
the upper body bias transistor is an upper body bias NMOS transistor;
the first upper body bias current node includes a drain node of the upper body bias NMOS transistor;
the second upper body bias current node includes a source node of the upper body bias NMOS transistor;
the upper body bias control node includes a gate node of the upper body bias NMOS transistor;
the lower body bias transistor is a lower body bias NMOS transistor;
the first lower body bias current node includes a drain node of the lower body bias NMOS transistor;
the second lower body bias current node includes a source node of the lower body bias NMOS transistor; and
the lower body bias control node includes a gate node of the lower body bias NMOS transistor.

10. The semiconductor device of claim 9, wherein:
the source node of the upper body bias NMOS transistor is electrically coupled to the body of the main NMOS transistor through an upper body bias resistor; and
the source node of the lower body bias NMOS transistor is electrically coupled to the body of the main NMOS transistor through a lower body bias resistor.

11. The semiconductor device of claim 8, wherein:
the upper control transistor is an upper control NMOS transistor;
the first upper current node of the upper control transistor includes a drain node of the upper control NMOS transistor;
the second upper current node of the upper control transistor includes a source node of the upper control NMOS transistor;
the upper control node of the upper control transistor includes a gate node of the upper control NMOS transistor;
a body of the upper control NMOS transistor is electrically coupled to a body of the upper body bias NMOS transistor;
the lower control transistor is a lower control NMOS transistor;
the first lower current node of the lower control transistor includes a drain node of the lower control NMOS transistor;
the second lower current node of the lower control transistor includes a source node of the lower control NMOS transistor;
the lower control node of the lower control transistor includes a gate node of the lower control NMOS transistor; and
a body of the lower control NMOS transistor is electrically coupled to a body of the lower body bias NMOS transistor.

12. The semiconductor device of claim 11, wherein:
the upper control NMOS transistor and the upper body bias NMOS transistor are located in an upper isolated well in the substrate; and
the lower control NMOS transistor and the lower body bias NMOS transistor are located in a lower isolated well in the substrate, the lower isolated well being separate from the upper isolated well.

13. The semiconductor device of claim 1, wherein:
the main transistor is a main NPN bipolar junction transistor (BJT);
the first ESD current node includes a first emitter/collector node of the main NPN BJT;
the second ESD current node includes a second emitter/collector node of the main NPN BJT; and
the ESD control node includes a base node of the main NPN BJT.

14. The semiconductor device of claim 13, wherein:
the second upper current node of the upper control transistor is electrically coupled to the base node of the main NPN BJT through an upper bias resistor; and
the second lower current node of the lower control transistor is electrically coupled to the base node of the main NPN BJT through a lower bias resistor.

15. The semiconductor device of claim 1, wherein:
- the upper trigger network is configured to reduce a first magnitude of the first transient on-state signal at the upper trigger node by at least 50 percent of a first peak magnitude within 100 nanoseconds of the first transient on-state signal reaching the first peak magnitude; and
- the lower trigger network is configured to reduce a second magnitude of the second transient on-state signal at the lower trigger node by at least 50 percent of a second peak magnitude within 100 nanoseconds of the second transient on-state signal reaching the second peak magnitude.

16. The semiconductor device of claim 1, wherein:
- the upper trigger network is configured to reduce a first magnitude of the first transient on-state signal at the upper trigger node by at least 50% of a first peak magnitude within 10 microseconds of the first transient on-state signal reaching the first peak magnitude; and
- the lower trigger network is configured to reduce a second magnitude of the second transient on-state signal at the lower trigger node by at least 50 percent of a second peak magnitude within 10 microseconds of the second transient on-state signal reaching the second peak magnitude.

* * * * *